United States Patent [19]

Miyawaki

[11] Patent Number: 5,301,164
[45] Date of Patent: Apr. 5, 1994

[54] CONTROL CIRCUIT FOR CONTROLLING AN OPERATION MODE IN A PSEUDO-STATIC RAM

[75] Inventor: Naokazu Miyawaki, Yokohama, Japan

[73] Assignee: Kabushiki Kaisha Toshiba, Kawasaki, Japan

[21] Appl. No.: 702,375

[22] Filed: May 20, 1991

[30] Foreign Application Priority Data

May 21, 1990 [JP] Japan .................................. 2-130893

[51] Int. Cl.⁵ ............................................... G11C 7/00
[52] U.S. Cl. ................................ 365/233; 307/465; 365/230.08
[58] Field of Search .................... 365/230.08, 233, 154; 307/465

[56] References Cited

U.S. PATENT DOCUMENTS

| | | | |
|---|---|---|---|
| 4,827,453 | 5/1989 | Sawada et al. | 365/222 |
| 4,841,488 | 6/1989 | Sanada | 365/233 |
| 4,879,683 | 11/1989 | Garcia | 365/154 X |
| 4,970,687 | 11/1990 | Usami et al. | 365/230.08 X |
| 4,984,216 | 1/1991 | Toda et al. | 365/230.08 |

FOREIGN PATENT DOCUMENTS 0239951 10/1987 European Pat. Off. .
0326183 8/1989 European Pat. Off. .

*Primary Examiner*—Benny Lee
*Attorney, Agent, or Firm*—Finnegan, Henderson, Farabow, Garrett & Dunner

[57] ABSTRACT

A control circuit for controlling an operation mode in a pseudo-static RAM. A chip enable control circuit generates a first group of control signals in synchronism with a change in level of a chip enable signal. A second control circuit receives a chip select signal and the first group of control signals, latches a chip select signal on the basis of a signal of the first group of control signals, and generates a second control signal in accordance with the latched signal. A third control circuit controls a write enable signal with an inverted replica of the second control signal and an inverted replica of a predetermined one of the first control signals in the first group of control signals.

4 Claims, 3 Drawing Sheets

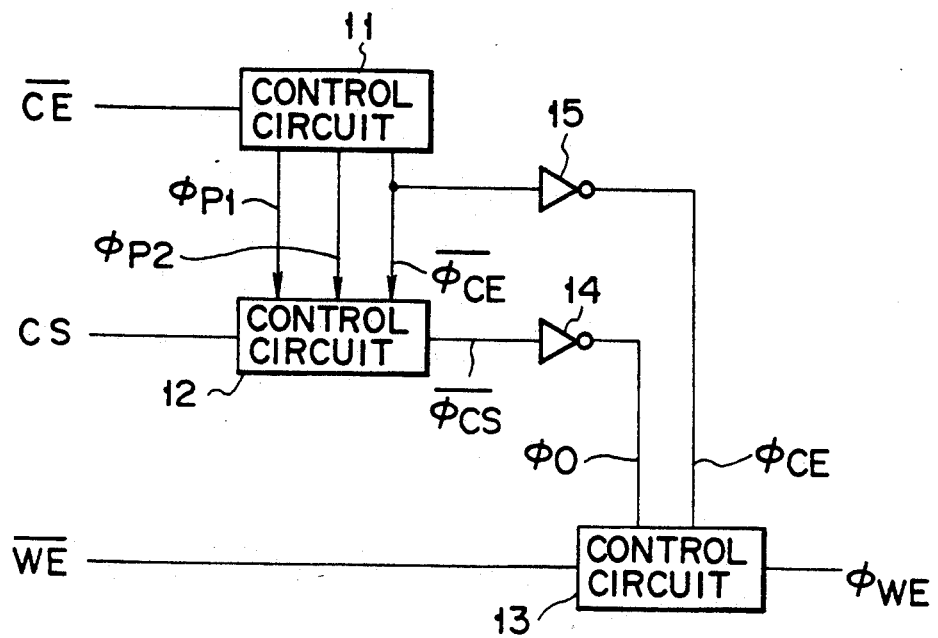
F I G. 1
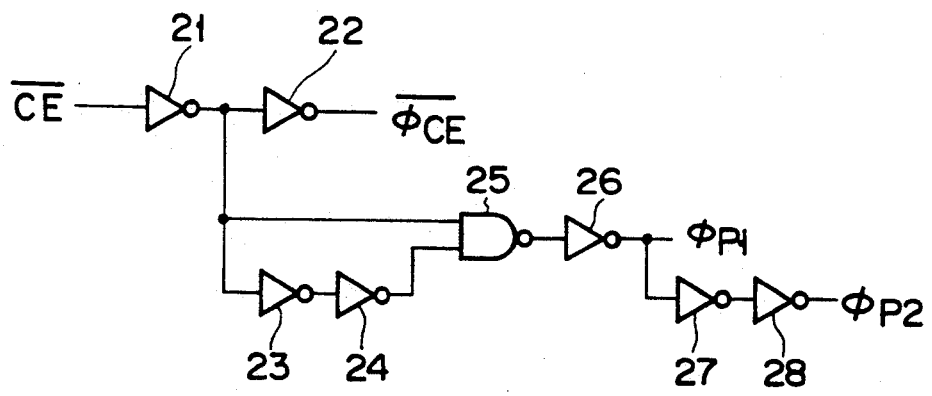
F I G. 2

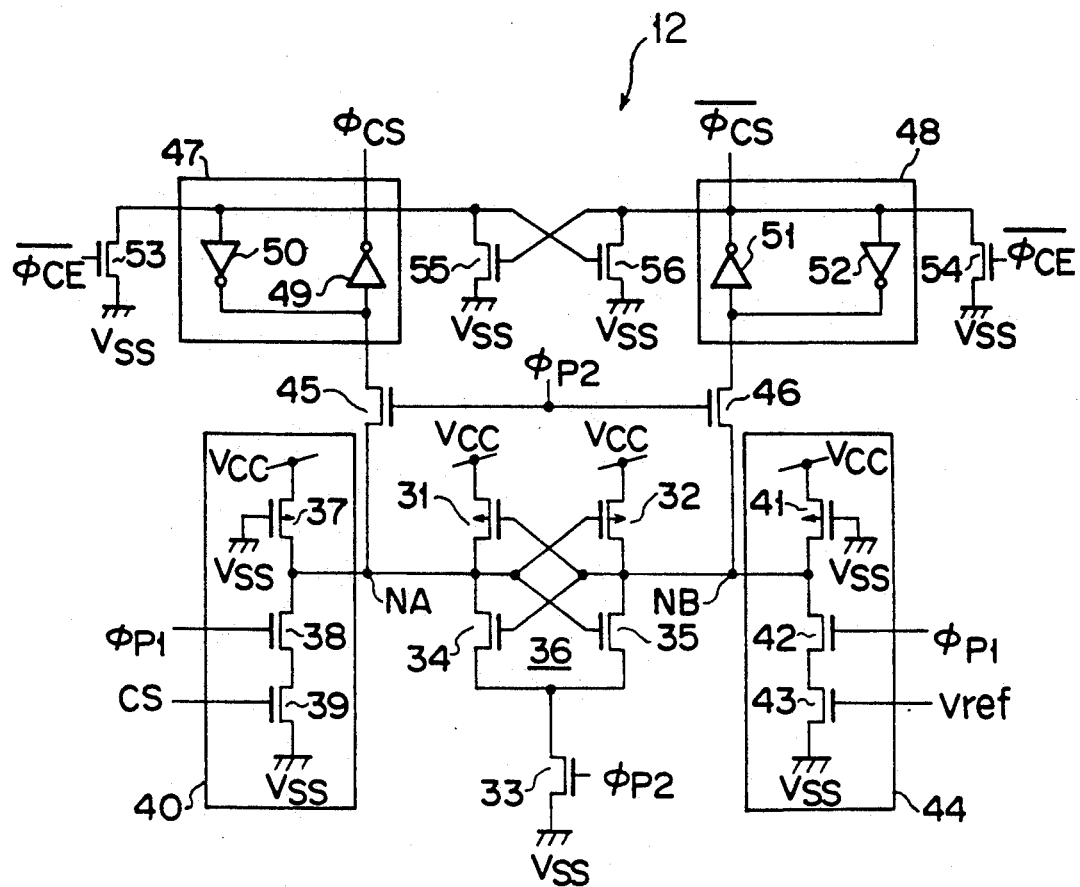
F I G. 3
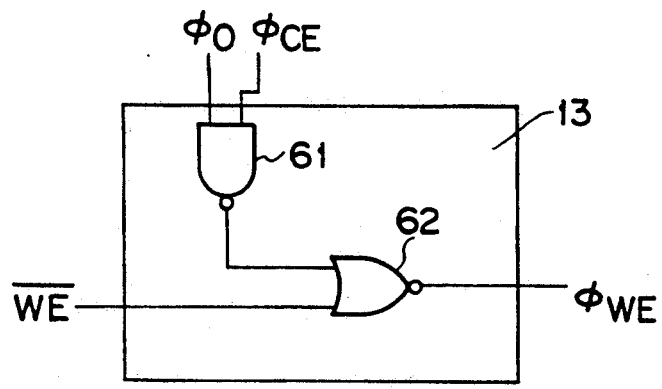
F I G. 4

CONTROL CIRCUIT FOR CONTROLLING AN OPERATION MODE IN A PSEUDO-STATIC RAM

BACKGROUND OF THE INVENTION

1. Field of the Invention

The present invention relates to a control circuit for controlling an operation mode in a pseudo-static RAM, in particular, a chip select standby mode in a pseudo-static RAM.

2. Description of the Related Art

In order to increase the integration density of a static RAM, memory cells are employed as in a dynamic RAM and a counter for refreshing is formed, together with the memory cells, on a common chip as known in the art. By so doing, a pseudo-static RAM (PSRAM) is realized which operates in a manner similar to that of a static RAM.

For PSRAM, write and read modes and CS (chip select) standby mode are known as specific modes. In a PSRAM, the operation mode is determined in accordance with the level of the chip select signal CS at a time when a chip enable signal $\overline{CE}$ of the PSRAM becomes a "low (L)" level. At the time when the chip enable signal $\overline{CE}$ becomes a "L" level, for example, a normal write or a normal read mode is involved if the chip select signal CS is a "high (H)" level and a CS standby mode is involved. If the chip select signal CS is a "L" level, at the time when the $\overline{CE}$ signal becomes a "L" level, a program operation, such as the write operation in a chip, is inhibited.

A control circuit associated with the CS standby mode in a PSRAM is arranged as set out below. A chip enable control circuit generates a group of control signals ($\phi\overline{CE}$, $\phi P1$, $\phi P2$) in synchronism with the chip enable signal $\overline{CE}$. A chip select control circuit latches the chip select signal CS with the group of use of the control signals ($\phi\overline{CE}$, $\phi P1$, $\phi P2$) and delivers a latched signal $\phi CS$ as an output signal. A write enable control circuit delivers a write enable signal $\overline{WE}$ in accordance with the latched signal $\phi CS$.

A relation of the operation of these control circuits to their associated signals is as follows.

At a time of normal data write-in operation, a write enable signal $\phi WE$ of the write enable control circuit is made active and the write series circuit is set in an operable state. With the chip enable signal $\overline{CE}$ at a "H" level, a normal standby state is involved. With the chip enable signal $\overline{CE}$ and chip select signal CS both at the "L" levels, the CS standby mode is involved. In a normal standby state and CS standby mode, the write enable signal $\phi WE$ is controlled by the write enable control circuit to be inactive. At this time, a dissipation current is suppressed to a minimum in the write series circuit.

As a signal for controlling the write enable control circuit, the latch signal $\phi CS$ is employed which is outputted from the chip select control circuit. The latch signal $\phi CS$ is delivered as an output signal when and only when the chip select signal CS is latched by the group of control signals ($\phi\overline{CE}$, $\phi P1$, $\phi P2$) subsequent to the transmission of the group of control signals ($\phi\overline{CE}$, $\phi P1$, $\phi P2$) to the chip select control circuit. Thus, the latch signal $\phi CS$ is delivered as an output signal with a considerable delay of time.

If the chip select signal CS is in the "H" level when the chip enable signal $\overline{CE}$ goes to the "L" level, a write enable signal $\phi WE$ of the write enable control circuit is made active to obtain a read mode. Since, however, the write enable control circuit is controlled by only the latched signal $\phi CS$, the generation of the write enable signal is delayed, causing a marked decrease in the write operation margin.

SUMMARY OF THE INVENTION

It is accordingly the object of the present invention to provide a control circuit for controlling an active mode in a pseudo-static RAM, which can reduce dissipation current at a standby time.

According to the present invention, there is provided a control circuit for controlling an operation mode in a pseudostatic RAM, characterized by:

a first control circuit for receiving a chip enable signal and generating a first control signal group in synchronism with a level variation of the chip enable signal;

a second control circuit for receiving a chip select signal and first control signal group, latching the chip select signal on the basis of the first control signal group and generating a second control signal in accordance with the latched signal; and a third control circuit for receiving a write enable signal and a second control signal and predetermined one of first control signals in the first control signal group, controlling the write enable signal in accordance with the second control signal and predetermined first control signal, and generating a third control signal for data write-in control.

According to the present invention, in order to prevent a delay in a variation of the third control signal for the transmission of an external-input write enable signal, the third control signal is so formed in the control circuit that a change occurs depending upon the state of the chip enable control circuit, not solely upon the state of the chip select control circuit as in the prior art. Since the third control signal of the write enable control circuit begins to vary without need to await the output of the chip select control circuit (a cause for a delay involved), the write enable control circuit can operate without the sacrifice of a PSRAM write operation margin and this can be realized, in the CS standby mode, with less dissipation power.

Additional objects and advantages of the invention will be set forth in the description which follows, and in part will be obvious from the description, or may be learned by practice of the invention. The objects and advantages of the invention may be realized and obtained by means of the apparatuses particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a circuit diagram showing part of an arrangement associated with a CS standby mode in a PSRAM of a first embodiment of the present invention;

FIG. 2 is a circuit diagram showing a part of the circuit arrangement shown in FIG. 1;

FIG. 3 is a circuit diagram showing another part of the circuit arrangement shown in FIG. 1;

FIG. 4 is a circuit diagram showing still another part of the circuit arrangement shown in FIG. 1.

DETAILED DESCRIPTION OF THE PREFERRED EMBODIMENTS

Figure 5:
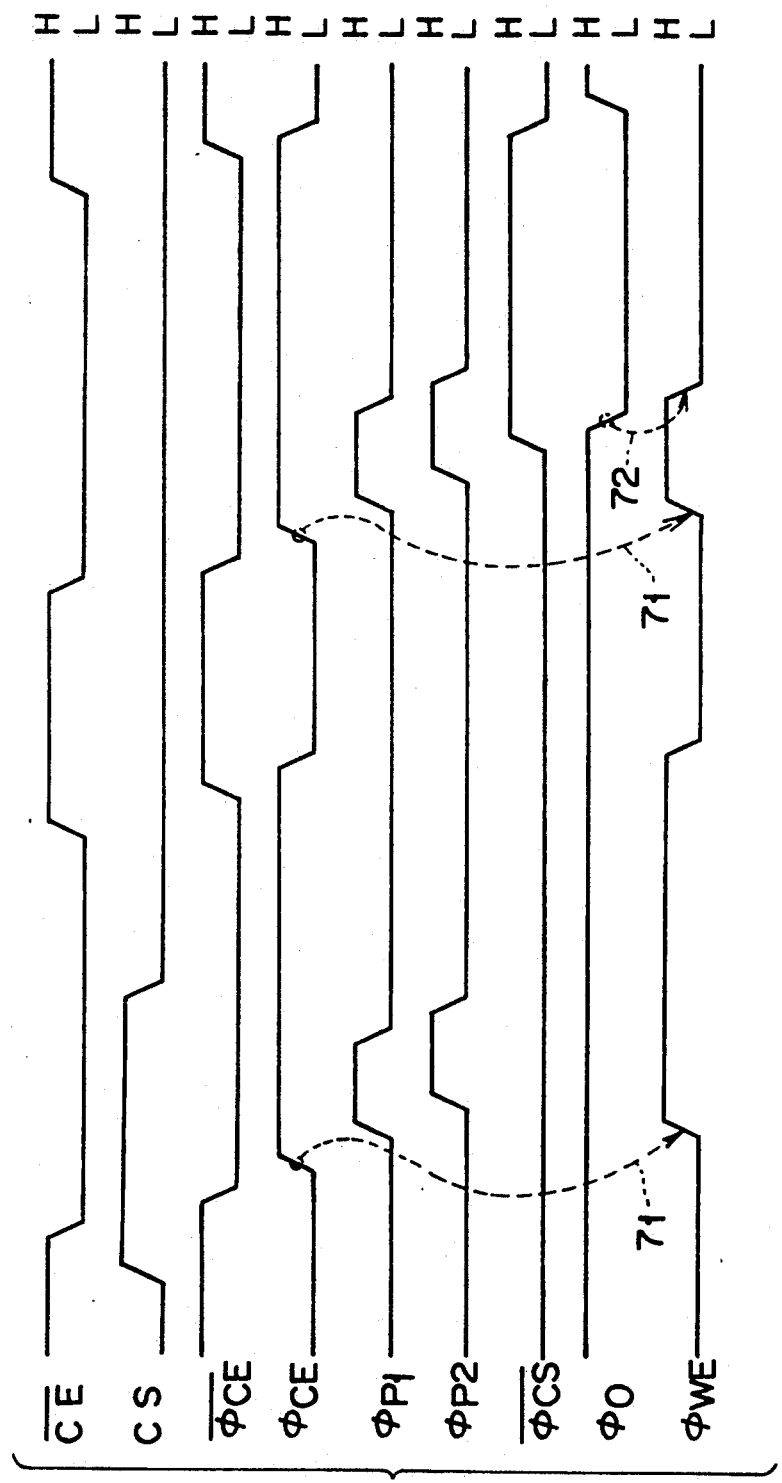
FIG. 5 is a timing chart showing respective signals showing an operation of the circuit shown in FIG. 1.

An embodiment of the present invention will be explained below with reference to the accompanying drawings.

FIG. 1 is a circuit diagram showing a control circuit corresponding to a section associated with a CS standby mode in a PSRAM of the present embodiment. A chip enable control circuit 11 generates a group of control signals ($\bar{\phi}CE$, $\phi P1$, $\phi P2$) in synchronism with a chip enable signal $\overline{CE}$. The chip select control circuit 12 receives the group of control signals ($\bar{\phi}CE$, $\phi P1$, $\phi P2$), latches a chip select signal CS with the use of these control signals, and delivers a latched signal $\bar{\phi}CS$ as an output signal. A write enable control circuit 13 is responsive to an inverted replica of the latched signal $\bar{\phi}CS$ and an inverted replica of the control signal coming from the control circuits 12 and 11, respectively, to receive a write enable signal $\overline{WE}$ and generate an internal write enable signal $\phi WE$, enabling data to be written into a memory cell, not shown. It is to be noted that the latched signals $\bar{\phi}CS$ and control signal $\bar{\phi}CE$ are supplied as the control signals $\phi O$ and $\phi CE$ to the write enable control circuit 13 after they have been passed through inverters 14 and 15, respectively.

FIG. 2 is a circuit diagram showing an arrangement of the chip enable control circuit 11 in the present embodiment. The chip enable signal $\overline{CE}$ is sequentially inverted through inverters 21 and 22 to provide the aforementioned control signal $\bar{\phi}CE$. The output of the inverter 21 is supplied to one input terminal of a NAND gate 25 sequentially through inverters 23 and 24 and directly to the other input terminal of the NAND gate 25. The output of the NAND gate 25 is inverted by an inverter 26 to obtain the aforementioned control signal $\phi P1$. Further, the output of the inverter 26 is inverted sequentially through inverters 27 and 28 to obtain the aforementioned control signal $\phi P2$.

FIG. 3 is a circuit diagram showing a practical arrangement of a chip select control circuit 12 in FIG. 1. A ground voltage $V_{ss}$ and reference voltages $V_{ref}$ and $V_{cc}$ are supplied to the control circuit 12 as shown in FIG. 3. The control circuit 12 includes a CMOS type differential amplifier 36 comprised of P channel MOS transistors 31, 32 and N channel MOS transistors 33, 34 and 35. The N channel MOS transistor 33 is of such an active type as to make the differential amplifier circuit active. The aforementioned control signal $\phi P2$ is supplied to the gate of the MOS transistor 33.

A chip select signal input section 40 comprises a P channel MOS transistor 37 and N channel MOS transistors 38, 39 and the output of the signal input section 40 is supplied to one input/output node NA of the differential amplifier circuit 36. A reference voltage input section 44 comprises a P channel MOS transistor 41 and N channel MOS transistors 42, 43 and the output of the reference voltage input section 44 is supplied to the other input/output node NB. The P channel MOS transistors 37 and 41 of the chip select signal input section 40 and reference voltage input section 44, respectively, are used as load transistors and a ground voltage Vss is applied to the gates of the transistors 37 and 41. The control signal $\phi P1$ as set out above is supplied to the gates of the N channel MOS transistors 38 and 42 of the chip select signal section and reference voltage input section 44, respectively. The chip select signal CS is supplied to the gate of the N channel MOS transistor 39 in the chip select signal input section 40 and a reference voltage Vref is supplied to the gate of the N channel MOS transistor 43 in the reference voltage input section 44, noting that the reference voltage Vref is set to a level intermediate between a high logic level and a low logic level voltage.

Signals of the paired input/output nodes NA, NB in the differential amplifier circuit 36 are supplied to latch sections 47 and 48 for generating latched signals $\phi CS$, $\bar{\phi}CS$. This is done through N channel MOS transistors 45 and 46 whose gates are supplied with the control signal $\phi P2$ set out above. The latches 47 and 48 are of such a type that the latch 47 comprises two inverters 49 and 50 with the output of the inverter 50 connected to the input of the inverter 49 and the latch 48 comprises two inverters 52 and 51 with the output of the inverter 52 connected to the input of the inverter 51. A reset N channel MOS transistor 53 is connected across the input terminal of the inverter 50 in the latch section 47 and a ground potential Vss and a reset N channel MOS transistor 54 is connected across the input terminal of the inverter 52 in the latch section and the ground potential Vss. The control signal $\phi CE$ as set out above is supplied to the gates of these N channel MOS transistors 53 and 54. An N channel MOS transistor 55 has its drain-to-source circuit connected across the inverter 49 in the latch circuit 47 and the ground potential Vss and an N channel MOS transistor 56 has its drain-to-source circuit connected across the inverter 51 in the latch section 48 and the ground potential Vss. These transistors 55 and 56 have their gates connected to their corresponding drains.

FIG. 4 is a detailed arrangement of a write enable control circuit 13 in the embodiment shown in FIG. 2. The control circuit 13 comprises a NAND gate 61 supplied with the control signals $\phi O$ and $\phi CE$ and NOR gate 62 supplied with an output of the NAND gate 61 and write enable signal $\overline{WE}$. The internal write enable signal $\phi WE$ is obtained as an output of the NOR gate 62.

The operation of the control circuit associated with a CS standby mode in a PSRAM of the present embodiment will be explained below with reference to a timing chart shown in FIG. 5.

With the chip enable signal $\overline{CE}$ going from a "H" level (standby state) to a "L" level, if the chip select signal CS is in the "H" level, a normal data read or a normal write operation is carried out. That is, a control signal $\bar{\phi}CE$ generated from the chip enable control circuit 21 goes low for a predetermined "L" level period in synchronism with a variation from the "H" to the "L" level of the chip enable signal $\overline{CE}$. Control signals $\phi P1$, $\phi P2$ become a "H" level for a period of time.

When the chip select control circuit 12 (see FIG. 3) receives the control signals as set out above, the N channel MOS transistor 38 in the chip select signal input section 40 and N channel MOS transistor 42 in the reference voltage input section 44 are turned ON with the "H" level of the control signal $\phi P1$ and a voltage corresponding to the chip select signal CS and reference voltage Vref emerge on the paired input/output nodes NA and NB in the differential amplifier circuit 36. The transistor 33 in the differential amplifier circuit 36 is turned ON with the "H" level of the control signal $\phi P2$, placing the differential amplifier circuit 36 in an active state. The voltages developed on the chip select signal input section 40 and reference voltage input section 44 compare with each other, detecting a chip select signal CS logic level.

With the control signal $\phi$P2 at the "H" level, the N channel MOS transistors 45 and 46 are turned ON and the detection outputs of the differential amplifier circuit 36 are supplied to the latching sections 47 and 48 where they are latched. In this case, as seen from the timing chart shown in FIG. 5, the signal CS becomes a "H" level and the reference voltage Vref is set to an intermediate level of a signal CS logic level. As a result, the latched signal $\phi$CS of the latch section 47 becomes a "H" level and the latched signal $\overline{\phi CS}$ of the latch section 48 becomes a "L" level.

The NOR gate circuit 62 in the write enable control circuit 13 (see FIG. 4) receives a "L" level write enable signal $\overline{WE}$, as well as an "L" output signal delivered from the NAND date circuit 61 which has been supplied with "H" level control signals $\phi$CE and $\phi$O, and delivers a "H" level signal as an internal write enable signal $\phi$WE. That is, a "H" level output control signal $\phi$CE is delivered from the inverter 15 (see FIG. 1) as indicated by an arrow 71 in FIG. 5 and a write enable signal $\overline{WE}$ is reversed at the NOR gate 62 in the write enable control circuit 13. The NOR gate 62 delivers a corresponding "H" level signal as an internal write enable signal $\phi$WE. Thereafter, a write series circuit performs a data write-in control, not shown.

After a chip select signal CS has become a "L" level, a chip enable signal $\overline{CE}$ changes to a "H" level standby mode. Then a "H" level control signal $\overline{\phi CE}$ is generated from the chip enable control circuit 11 and the transistors 53 and 54 in the chip select control circuit 13 (see FIG. 3) are turned ON. When this occurs, the latch sections 47 and 48 are reset and the signals $\phi$CS and $\overline{\phi CS}$ are set to "L" levels. Thus, the control signals $\phi$O and $\phi$CE are supplied to the write enable control circuit 13 as shown in FIG. 1 and become a "H" and a "L" level, respectively. An output of the NAND gate circuit 61 in the write enable control circuit 13 becomes a "H" level. As a result, the internal write enable signal $\phi$WE changes from the "H" level to a "L" level. Thereafter, a data write control operation is inhibited in a data write series circuit.

Then a chip enable signal $\overline{CE}$ changes from a "H" to a "L" level at which time a CS standby mode is involved with the chip select signal CS at the "L" level. Then the control signal $\overline{\phi CE}$ of the chip enable control circuit 11 becomes a "L" level for a predetermined period of time and the control signals $\phi$P1 and $\phi$P2 of the chip enable control circuit 11 becomes a "H" level during a predetermined period of time.

When the chip select control circuit 12 receives these control signals, an inverted replica $\phi$CE of the inverter 15 initially becomes a "H" level as indicated by an arrow 71 in FIG. 5 and the write enable signal $\overline{WE}$ is inverted in the NOR gate 62 in the write enable control circuit 13 and delivered as a "H" level internal write enable signal $\phi$WE from the write enable control circuit 13. Since, however, the latch signal $\phi$CS of the latch section 47 and latch signal $\overline{\phi CS}$ of the latch section 48 become a "L" and "H" level, respectively, with the chip select signal CS at a "L" level, an inverted control signal $\phi$O of the latch signal $\overline{\phi CS}$ changes from the "H" level to a "L" level. As a result, the internal write enable signal $\phi$WE rapidly changes to a "L" level as indicated by an arrow 72 in FIG. 5 and a data write control operation is inhibited in the write series circuit, not shown.

In this way, the control signal $\phi$O supplied to the write enable control circuit 13 is normally placed in a high potential level and becomes a low potential level only when the chip select signal CS becomes a low potential level with a fall in the chip enable signal $\overline{CE}$. It is designed that, when the chip enable signal $\overline{CE}$ goes high, the control signal $\phi$O goes back to a high potential level. By so doing, the operation delay time of the write enable control circuit can be made shorter than in the conventional standby mode, securing no loss of the write operation margin. Since, at a time of the CS standby mode, the write enable signal $\overline{WE}$ is rapidly rendered in an non-active state, it is possible to simultaneously realize a circuit arrangement of less dissipation power.

According to the present invention, as set out above, a control circuit for controlling an operation mode in a pseudostatic RAM for reducing a dissipation current at the standby time is accomplished without a sacrifice of the write operation margin.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept a defined by the appended claims and their equivalents.

What is claimed is:

1. A control circuit for controlling an operation mode in a pseudo-static RAM, comprising:
   a first control circuit, which receives a chip enable signal, for generating a first group of control signals in synchronism with said chip enable signal, said first group of control signals comprising a first delay signal derived from said chip enable signal, a second delay signal controlled by a fall in timing of said chip enable signal, and a third delay signal generated later in time than said second delay signal;
   a second control circuit which receives said first group of control signals and a chip select signal, said second control circuit latching said chip select signal at a predetermined timing of said first group of control signals thereby generating a second control signal corresponding to the latched chip select signal; and
   a third control circuit which receives a write enable signal, said second control signal, and a predetermined control signal having a phase which is opposite to the phase of said first delay signal supplied from said first control circuit to said second control circuit earlier in time in response to said chip enable signal, said third control circuit controlling said write enable signal in accordance with the predetermined control signal and said second control signal thereby generating a third control signal for data write-in control.

2. The control circuit according to claim 1, wherein said second control circuit includes a CMOS-type differential amplifier for receiving and comparing said chip select signal and a reference potential and a latch circuit connected to said differential amplifier for latching, in response to at least one of said first group of control signals, an output of said differential amplifier provides said second control signal.

3. The control circuit according to claim 2, wherein said reference potential is equal to a potential level intermediate between a high logic level and a low logic level.

4. The control circuit according to claim 1, wherein said third control circuit comprises a NAND circuit which receives said second control signal and said predetermined control signal and a NOR circuit which receives an output of said NAND circuit and said write enable signal, wherein said third control signal is an output signal from said NOR circuit.

* * * * *